(12) United States Patent
Lou et al.

(10) Patent No.: US 11,943,986 B2
(45) Date of Patent: Mar. 26, 2024

(54) DISPLAY SUBSTRATE, DISPLAY PANEL AND DISPLAY DEVICE

(71) Applicant: KunShan Go-Visionox Opto-Electronics Co., Ltd., Jiangsu (CN)

(72) Inventors: Junhui Lou, Kunshan (CN); Lu Zhang, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 415 days.

(21) Appl. No.: 17/361,748

(22) Filed: Jun. 29, 2021

(65) Prior Publication Data

US 2021/0327972 A1 Oct. 21, 2021

Related U.S. Application Data

(63) Continuation of application No. PCT/CN2020/076475, filed on Feb. 24, 2020.

(30) Foreign Application Priority Data

Jun. 5, 2019 (CN) .......................... 201910487646.X

(51) Int. Cl.
*H01L 27/32* (2006.01)
*G09G 3/3225* (2016.01)
(Continued)

(52) U.S. Cl.
CPC ......... *H10K 59/353* (2023.02); *G09G 3/3225* (2013.01); *H10K 50/84* (2023.02);
(Continued)

(58) Field of Classification Search
None
See application file for complete search history.

(56) References Cited

U.S. PATENT DOCUMENTS

| 10,007,114 | B2 | 6/2018 | Murata |
| 2016/0322440 | A1 | 11/2016 | Murata |
| 2022/0037428 | A1* | 2/2022 | Lou ...................... H10K 59/352 |

FOREIGN PATENT DOCUMENTS

| CN | 104319283 A | 1/2015 |
| CN | 104362170 A | 2/2015 |

(Continued)

OTHER PUBLICATIONS

State Intellectual Property Office of the People's Republic of China, Office Action and Search Report Issued in Application No. 201910487646X , dated Apr. 30, 2020, 20 pages. (Submitted with Machine Translation).

(Continued)

*Primary Examiner* — Jack S Chen

(74) *Attorney, Agent, or Firm* — Maier & Maier, PLLC

(57) ABSTRACT

A display substrate and a display panel are provided. The display substrate includes: a substrate. The display substrate includes a first display region and a second display region. A light transmittance of the first display region is greater than a light transmittance of the second display region. The first display region is provided with a first pixel unit, and the second display region is provided with a second pixel unit, wherein a ratio of a first size of the first pixel unit in a first direction to a second size of the first pixel unit in a second direction is substantially same as a ratio of a first size of the second pixel unit in the first direction to a second size of the second pixel unit in the second direction, the first direction intersecting with the second direction.

19 Claims, 7 Drawing Sheets

(51) Int. Cl.
*H10K 50/84* (2023.01)
*H10K 59/121* (2023.01)
*H10K 59/122* (2023.01)
*H10K 59/35* (2023.01)

(52) U.S. Cl.
CPC ......... *H10K 59/121* (2023.02); *H10K 59/122* (2023.02); *G09G 2300/0452* (2013.01)

(56) References Cited

FOREIGN PATENT DOCUMENTS

| CN | 104319283 B | 3/2016 |
|----|-------------|--------|
| CN | 106098732 A | 11/2016 |
| CN | 107768545 A | 3/2018 |
| CN | 107870689 A | 4/2018 |
| CN | 108269840 A | 7/2018 |
| CN | 108336117 A | 7/2018 |
| CN | 108520888 A | 9/2018 |
| CN | 109192076 A | 1/2019 |
| CN | 109427850 A | 3/2019 |
| CN | 208622778 U | 3/2019 |
| CN | 109801903 A | 5/2019 |
| CN | 110767720 A | 2/2020 |

OTHER PUBLICATIONS

ISA State Intellectual Property Office of the People's Republic of China, International Search Report Issued in Application No. PCT/CN2020/076475, dated May 11, 2020, WIPO, 4 pages.

TW Patent Office, Office Action Issued in Application No. 109107497, dated Oct. 21, 2020, 14 pages. (Subbmited with English Translation).

ISA State Intellectual Property Office of the People's Republic of China, Written Opinion of the International Searching Authority Issued in Application No. PCT/CN2020/076475, dated May 11, 2020, WIPO, 7 pages.

\* cited by examiner

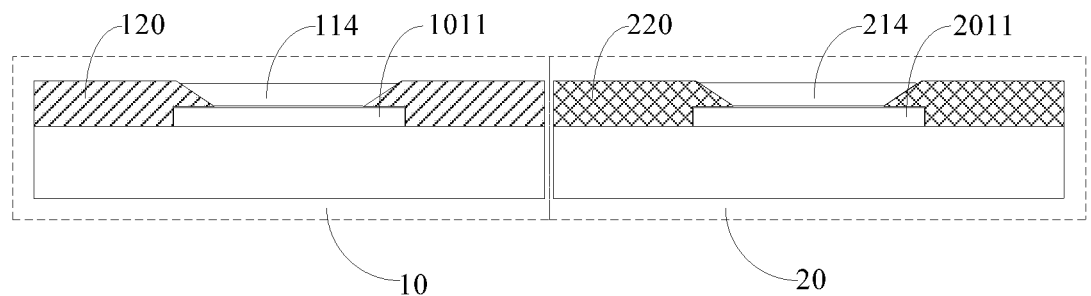
FIG. 14
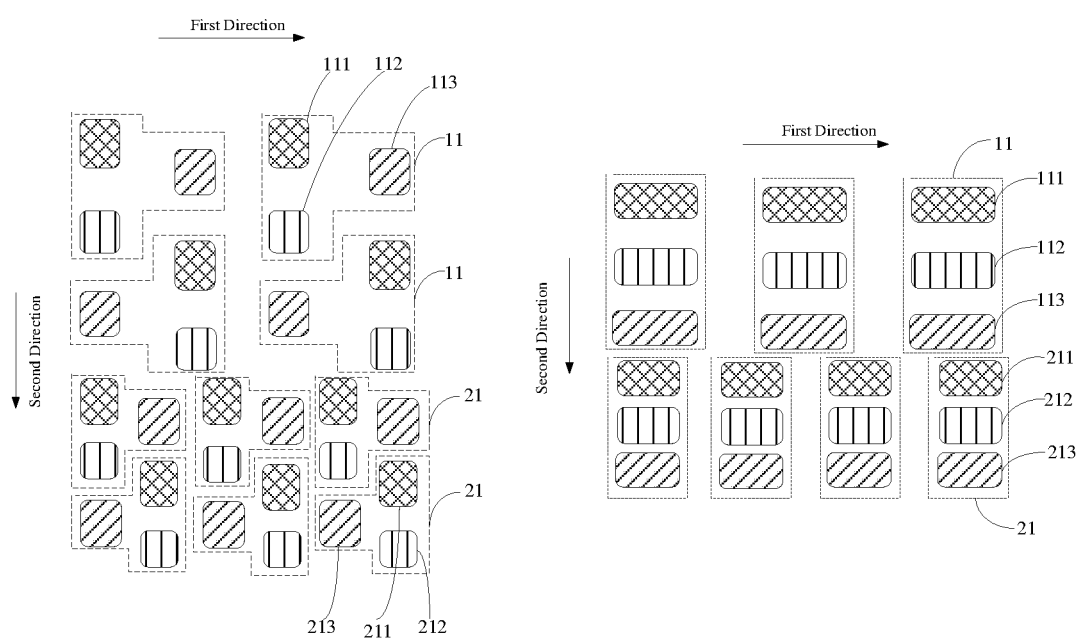
FIG. 15
FIG. 16

DISPLAY SUBSTRATE, DISPLAY PANEL AND DISPLAY DEVICE

CROSS REFERENCE TO RELATED APPLICATIONS

The present application is a continuation application of PCT application under PCT/CN2020/076475, which claims the priority of Chinese patent application CN 201910487646.X filed with National Intellectual Property Administration, P.R.C. on Jun. 5, 2019, contents of which is incorporated herein by reference in entirety.

TECHNICAL FIELD

This disclosure relates to the field of display technology, and in particular to a display substrate, a display panel and a display device.

BACKGROUND

With the rapid development of electronic devices, users have more and more requirements on the screen-to-body ratio, which makes the full-screen display of electronic devices more and more concerned in the industry. Conventional electronic devices such as mobile phones and tablet computers are required to be integrated with front-facing cameras, earpieces and infrared sensing elements. Therefore, a notch is provided in the display panel for accommodating cameras, earpieces and infrared sensing elements, etc. However, an area of the notch, such as a notch screen, cannot be used to display images. Alternatively, a hole may be provided on the screen for accommodating the cameras. In this way, for the electronic devices implementing photographing function, external light may enter a photosensitive element disposed below the screen via the hole provided in the screen. These electronic devices are not full screens in the true sense, and images cannot be displayed in all areas of the entire screen, for example, images cannot be displayed in the camera area.

SUMMARY

Embodiments of the present disclosure provide a display substrate, including: a substrate; a first display region, in which a plurality of first pixel units are disposed, each of the plurality of first pixel units including first OLED pixels of n colors, and the first OLED pixels are disposed on the substrate, each of the first OLED pixels includes at least two first sub-pixels arranged at intervals in a first direction, and each of the first sub-pixels includes: a first electrode block; a first light-emitting structure block disposed on the first electrode block; and a second electrode disposed on the first light-emitting structure block; and a second display region, a light transmittance of the first display region being greater than a light transmittance of the second display region, a plurality of second pixel units disposed in the second display region, each of the second pixel units including second OLED pixels of n colors, and the second OLED pixels disposed on the substrate; wherein, adjacent first sub-pixels belonging to different first OLED pixels are arranged at intervals in a second direction; adjacent first electrode blocks of each of the plurality of first OLED pixels are electrically connected; and a ratio of a first size of the first pixel unit in the first direction to a second size of the first pixel unit in the second direction is substantially same as a ratio of a first size of the second pixel unit in the first direction to a second size of the second pixel unit in the second direction, wherein the first direction intersects the second direction, and n is a natural number greater than or equal to 3.

Embodiments of the present disclosure further provide a display substrate, including: a first display region in which a plurality of first pixel units are disposed, each of the plurality of first pixel units comprises first OLED pixels of n colors; and a second display region in which a plurality of second pixel units are disposed, each of the plurality of second pixel units comprises second OLED pixels of n colors, where n is a natural number greater than or equal to 3; a light transmittance of the first display region is greater than a light transmittance of the second display region, and a density of the plurality of first pixel units is less than a density of the plurality of second pixel units; a ratio of a first size of the first pixel unit in a first direction to a second size of the first pixel unit in a second direction is substantially same as a ratio of a first size of the second pixel in a first direction to a second size of the second pixel in a second direction, wherein the first direction intersects the second direction.

Embodiments of the present disclosure further provide a display panel, including the display substrate as described and an encapsulation structure disposed on the display substrate.

Embodiments of the present disclosure further provide a display device, including: a device body with a device area; and the display panel as described above, covering the device body; wherein the device area is located below the first display region, and a photosensitive device that emits or collects light passing through the first display region is provided in the device area.

In the display substrate, the display panel, and the display device according to the embodiments of the present disclosure, the light transmittance of the first display region is greater than the light transmittance of the second display region, and the photosensitive device can be arranged below the first display region to ensure that the full-screen display of the display substrate is achieved in a case that the photosensitive device is in normal operation. The ratio of the first size of the first pixel unit to the second size of the first pixel unit and the ratio of the first size of the second pixel unit to the second size of the second pixel unit are substantially the same, so the shapes of the first pixel unit and the second pixel unit are similar and the probability of image deformation in display by the display substrate which is caused by relatively great difference between shapes of the first and second pixel units may be reduced, thereby improving the display effect of the display substrate and enhancing the user experience.

BRIEF DESCRIPTION OF THE DRAWINGS

FIG. 14 illustrates a partial cross-sectional view of a display substrate according to an embodiment of the present disclosure.

FIG. 15 illustrates a partial schematic diagram of arrangement of pixel units in the first display region and in the second display region of a display substrate according to another embodiment of the present disclosure.

FIG. 16 illustrates a partial schematic diagram of arrangement of pixel units in the first display region and in the second display region of a display substrate according to still another embodiment of the present disclosure.

DETAILED DESCRIPTION OF THE EMBODIMENTS

Exemplary embodiments will be described in detail here, and examples thereof are illustrated in the accompanying figures. When the following description refers to the accompanying figures, unless otherwise indicated, same reference signs in different figures designate same or similar elements. The implementation manners described in the following exemplary embodiments do not represent all implementation manners consistent with the present disclosure. Rather, they are merely examples of devices consistent with some aspects of the disclosure as defined in the appended claims.

In smart electronic devices such as mobile phones and tablet computers, it is necessary to integrate photosensitive devices such as front-facing cameras, light sensors, etc. Therefore, in related technologies, transparent display screens are provided on the electronic devices, and the photosensitive devices are disposed under the transparent display screens, thus full-screen display of the electronic devices are achieved while guaranteeing proper operations of the photosensitive devices.

In order to increase transparency of the transparent display screen, a pixel density of the transparent display screen is generally made lower than a pixel density of the non-transparent display screen. However, the inventors of the present disclosure found that images may be deformed in a case the electronic devices display, which will affect the user experience.

To solve the above-mentioned problems, embodiments of the present disclosure provide a display substrate, a display panel and a display device, which can solve the above-mentioned problem well.

The display substrate, the display panel, and the display device according to the embodiments of the present disclosure will be described in detail hereinafter with reference to the accompanying figures. In the case of no interference, features of following embodiments and implementations may be supplemented to each other or combined with each other.

Figure 1:
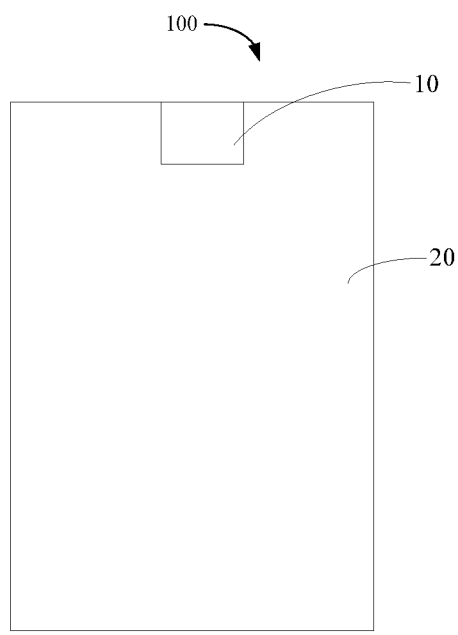
FIG. 1 illustrates a top view of a display substrate according to an embodiment of the present disclosure.
Figure 2:
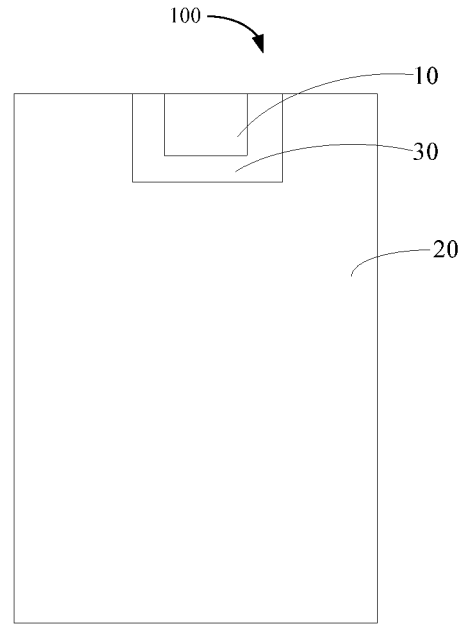
FIG. 2 illustrates a top view of a display substrate according to an embodiment of the present disclosure.
Figure 3:
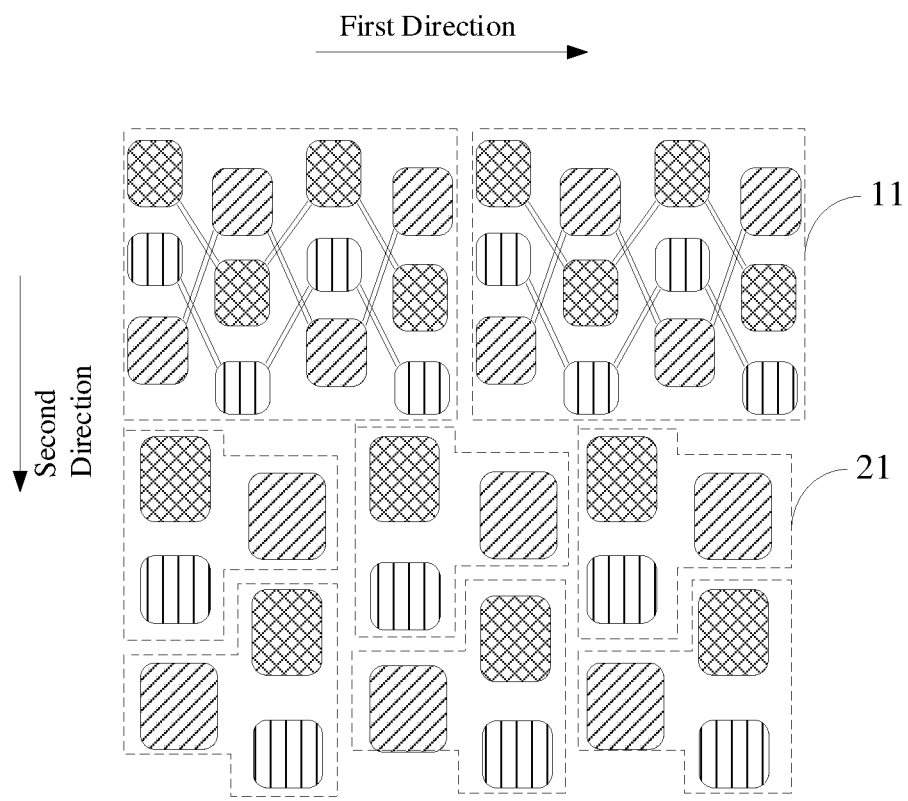
FIG. 3 illustrates a partial schematic view of arrangement of pixel units in a first display region and a second display region of a display substrate according to an embodiment of the present disclosure.
Figure 4:
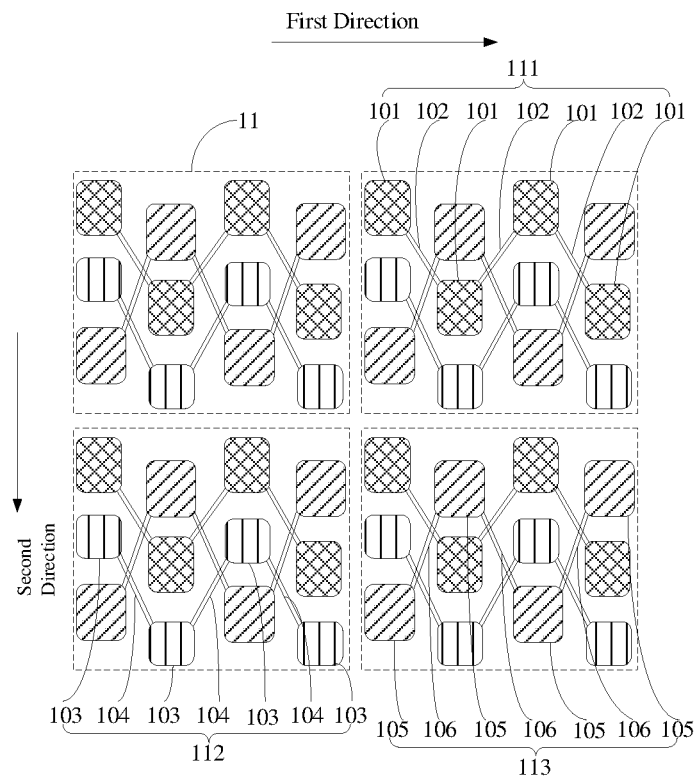
FIG. 4 illustrates a partial schematic view of arrangement of first OLED pixels in a first display region of a display substrate according to an embodiment of the present disclosure.
Figure 7:
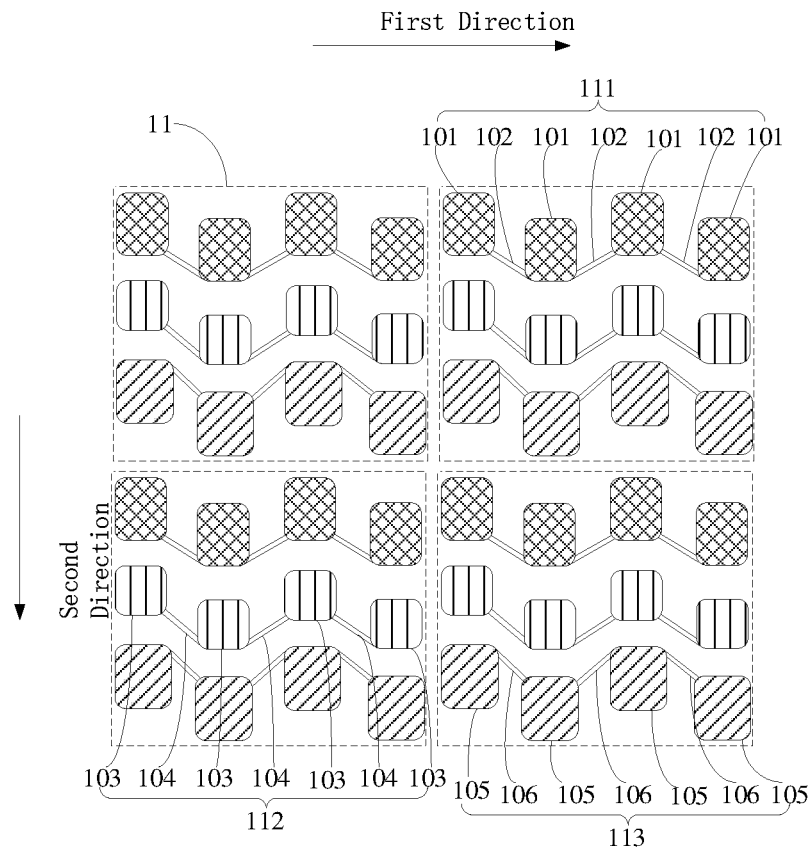
FIG. 7 illustrates a partial schematic diagram of arrangement of first OLED pixels in the first display region of a display substrate according to another embodiment of the present disclosure.
Figure 11:
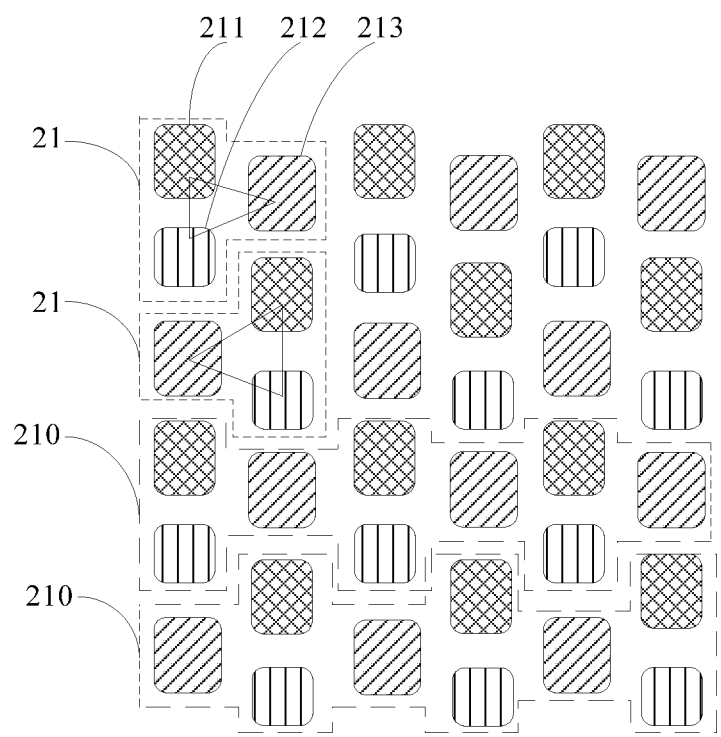
FIG. 11 illustrates a partial schematic diagram of arrangement of second OLED pixels in a second display region of the display substrate according to an embodiment of the present disclosure.

Embodiments of the present disclosure provide a display substrate. Referring to FIG. 1 and FIG. 2, a display region of a display substrate 100 includes a first display region 10 and a second display region 20, and a transmittance of the first display region 10 is greater than a transmittance of the second display region 20. The display substrate 100 may further include a substrate. Referring to FIG. 3, FIG. 4, and FIG. 7, a plurality of first pixel units 11 are provided in the first display region 10, and the first pixel units 11 include first organic light-emitting diode (OLED) pixels 111, 112, and 113 of n colors, for example, the first OLED pixels 111, 112, and 113 respectively correspond to a different color. Referring to FIG. 11, a plurality of second pixel units 21 are provided in the second display region 20, and the second pixel units 21 include second OLED pixels 211, 212, and 213 of n colors, for example, the second OLED pixels 211, 212, and 213 respectively correspond to different colors. Where, n is a natural number not less than 3. The first OLED pixels and the second OLED pixels are disposed on the substrate.

Referring again to FIG. 4 and FIG. 7, the first OLED pixel 111 includes at least two first sub-pixels 101 arranged at intervals in a first direction. Similarly, the first OLED pixel 112 includes at least two first sub-pixels 103 arranged at intervals in the first direction, and the first OLED pixel 113 includes at least two first sub-pixels 105 arranged at intervals in the first direction. The first sub-pixels 101, 103, 105 that are adjacent to each other and belong to different first OLED pixels (for example, corresponding to different colors) are arranged at intervals in a second direction which intersects the first direction. Each of the first sub-pixels 101, 103, 105 include a first electrode block, a first light-emitting structure block provided on the first electrode block, and a second electrode provided on the first light-emitting structure block, and first electrode blocks (for example, corresponding to the same color) of two adjacent first sub-pixels 101 of the same first OLED pixel 111 are electrically connected. Similarly, first electrode blocks of two adjacent first sub-pixels 103 of the same first OLED pixel 112 are electrically connected, and first electrodes of two adjacent first sub-pixels 105 of the same first OLED pixel 113 are electrically connected.

A ratio of a first size of the first pixel unit 11 to a second size of the first pixel unit 11 and a ratio of a first size of the second pixel unit 21 to a second size of the second pixel unit 21 are substantially the same. The first size is a size of the pixel unit in the first direction, and the second size is a size of the pixel unit in the second direction, wherein the first direction intersects the second direction. That is, the first size of the first pixel unit 11 is a size of the first pixel unit 11 in the first direction, and the second size of the first pixel unit 11 is a size of the first pixel unit 11 in the second direction. The first size of the second pixel unit 21 is a size of the second pixel unit 21 in the first direction, and the second size of the second pixel unit 21 is a size of the second pixel unit 21 in the second direction.

In the display substrate according to the embodiments of the present disclosure, transmittance of the first display region 10 is greater than transmittance of the second display region 20, and photosensitive devices may be disposed under the first display region 10 to achieve full-screen display of the display substrate while ensuring proper operations of the photosensitive device. The first OLED pixel includes at least two first sub-pixels, and in a same first OLED pixel, the first electrode blocks of two adjacent first sub-pixels are electrically connected, then only one of the first electrode blocks of the first sub-pixels of the same first OLED pixel is required to be connected to a signal line or a pixel circuit, which can reduce complexity of wiring and complexity in structure of the first display region 10, thereby reducing diffraction of external light in a case passing through the first display region 10. Thus, influence of diffraction of external light on the photosensitive devices disposed under the first display region 10 is reduced. At the same time, the ratio of the first size of the first pixel unit 11 to the second size of the first pixel unit 11 and the ratio of the first size of the second pixel unit 21 to the second size of the second pixel unit 21 are substantially the same, then shapes of the first pixel unit 21 and the second pixel unit 22 are similar to each other, thus probability of image deformation during display by the display substrate 100 due to large difference in the shapes of the first pixel unit and the second pixel unit is reduced, and display effect of the display substrate 100 is improved, thereby enhancing the user experience.

In the embodiment of the present disclosure, the ratio of the first size of the first pixel unit 11 to the second size of the first pixel unit 11 is the first ratio, and the ratio of the first size of the second pixel unit 21 to the second size of the second pixel unit 21 is the second ratio. That the first ratio and the second ratio are substantially the same means that the first ratio and the second ratio are equal to each other, or difference between the first ratio and the second ratio is within a specified range.

In a case that the first ratio of the first pixel unit 11 and the second ratio of the second pixel unit 21 are the same, the first size of the first pixel unit 11 and the first size of the second pixel unit 21 may be the same or different. Typically, an area of the first pixel unit 11 is greater than an area of the second pixel unit 21, that is, the first size of the first pixel unit 11 is greater than the first size of the second pixel unit 21, and the second size of the first pixel unit is greater than the second size of the second pixel unit 21.

In the embodiment of the present disclosure, at least two first sub-pixels of the same first OLED pixel are arranged at intervals in the first direction, which means that at least two first sub-pixels of the same first OLED pixel are generally arranged in the first direction. Axes of the at least two first sub-pixels of the same first OLED pixel in the first direction may coincide with each other, or may not coincide with each other. For example, as illustrated in FIGS. 4 and 7, a plurality of first sub-pixels of the same first OLED pixel are staggered in the first direction, which is also considered as that the plurality of first sub-pixels of the same first OLED pixel are arranged at intervals in the first direction.

That the adjacent first sub-pixels belonging to different first OLED pixels are arranged at intervals in the second direction may include two cases.

In the first case, referring to FIG. 7, the n first OLED pixels in the same first pixel unit 11 are arranged at intervals in the second direction, and the first sub-pixels in the same first OLED pixel are all disposed at a same side of another first OLED pixel (for example, an adjacent first OLED pixel). In such a case, for adjacent different first OLED pixels, first sub-pixels thereof are arranged at intervals in the second direction. For example, the first sub-pixels 103 in the first OLED pixel 112 in FIG. 7 are all disposed on the same side of the first OLED pixel 113.

In the second case, referring to FIG. 4, among the n first OLED pixels in the same first pixel unit 11, for two adjacent first OLED pixels, a part of the first sub-pixels of one of the first OLED pixel are disposed on one side of another first OLED pixel (for example, an adjacent first OLED pixel), and another part of the first sub-pixels are disposed on the other side of the other first OLED pixel. In such a case, the first sub-pixels belonging to two adjacent first OLED pixels are arranged at intervals in the second direction. For example, a part of the first sub-pixels 103 of the first OLED pixel 112 in FIG. 4 is disposed on the upper side of the first OLED pixel 113, and another part of the first sub-pixels 103 of the first OLED pixel 112 is disposed on the lower side of the first OLED pixel 113, and the first sub-pixel 103 and first sub-pixel 105 that are adjacent to each other are arranged at intervals in the second direction.

The size of the first pixel unit 11 in the first direction refers to the maximum size of the first pixel unit 11 in the first direction, and the size of the first pixel unit 11 in the second direction refers to the maximum size of the first pixel unit 11 in the second direction. The size of the second pixel unit 21 in the first direction refers to the maximum size of the second pixel unit 21 in the first direction, and the size of the second pixel unit 21 in the second direction refers to the maximum size of the second pixel unit 21 in the second direction.

In an embodiment of the present disclosure, the first direction and the second direction may be perpendicular to each other. The first direction may be a row direction and the second direction may be a column direction; or, the first direction may be a column direction, and the second direction may be a row direction. Wherein, FIGS. 4 to 10 only take the first direction as the row direction and the second direction as the column direction as examples for illustration, and other cases are not illustrated.

In an embodiment of the present disclosure, arrangement manner of the first sub-pixels of the first pixel unit 11 is same as arrangement manner of the second OLED pixels of the second pixel unit. Wherein, the arrangement manner of pixels refers to a arrangement manner of pixels, such as arrangement order and arrangement position relationship of adjacent pixels of the same color, arrangement order and arrangement position relationship of pixels of different colors, etc.

The arrangement manner of pixels is not necessarily related to the size of the pixel unit where the pixels are located. For example, the arrangement manner of the first sub-pixels of the first pixel unit 11 is same as the arrangement discipline of the second OLED pixels of the second pixel unit 21, but the first size of the first pixel unit 11 is not same as the first size of the second pixel unit, and the second size of the first pixel unit 11 is not same as the second size of the second pixel unit 21.

By setting the arrangement manner of the first sub-pixels of the first pixel unit to be the same as the arrangement manner of the second OLED pixels of the second pixel unit, display effect of the first display region 10 and display effect of the second display region 20 are more uniform in a case the display substrate 100 displays, which facilitates to enhance the user experience.

In an embodiment of the present disclosure, n=3, that is, the first pixel unit 11 includes first OLED pixels of three different colors, and the second pixel unit 21 includes second OLED pixels of three different colors. The three colors may be red, green and blue, or may be other colors. Embodiments of the present disclosure will be described hereinafter by taking the three colors being red, green and blue as an example, and cases that the three colors are other colors will not be introduced. Of course, in other embodiments of the present disclosure, n may also be greater than 3.

Referring to FIG. 4 or 7, the first pixel unit 11 includes a first red OLED pixel 111, a first green OLED pixel 112, and a first blue OLED pixel 113, and the first red OLED pixel 111 includes at least two first red sub-pixels 101, the first green OLED pixel 112 includes at least two first green sub-pixels 103, and the first blue OLED pixel 113 includes at least two first blue sub-pixels 105. Referring to FIG. 11, the second pixel unit 21 may include a second red OLED pixel 211, a second green OLED pixel 212, and a second blue OLED pixel 213. Further, the number of the second red OLED pixel 211, the second green OLED pixel 212, and the second blue OLED pixel 213 of the second pixel unit 21 is one respectively.

In an embodiment of the present disclosure, the first sub-pixels of different colors in the first pixel unit 11 may be arranged in a Y shape, that is, arranged in a triangle; the second OLED pixels of different colors that are adjacent to each other in the second pixel unit 21 can be arranged in a Y shape, that is, arranged in a triangle. Referring to FIG. 4, the first red sub-pixel 101, the first green sub-pixel 103, and the first blue sub-pixel 105 that are disposed adjacent to each other are arranged in a Y shape. Referring to FIG. 11, the second red OLED pixel 211, the second green OLED pixel 212, and the second blue OLED pixel 213 that are disposed adjacent to each other are arranged in a Y shape.

In this way, the adjacent second OLED pixels corresponding to the three colors in the second pixel unit 21, as well as the adjacent first sub-pixels corresponding to the three colors in the first pixel unit 11, are arranged in a triangle or Y shape, so that display effects of the first display region 10 and the second display region 20 are more uniform in a case the display substrate 100 displays, which facilitates to enhance the user experience. In addition, the first sub-pixels of the same color are distributed relatively uniformly, so that openings on a mask plate for manufacturing the first light-emitting structure of the first sub-pixels are distributed regularly, which reduces wrinkles of the mask plate; distribution of the second OLED pixels is relatively uniform, so that openings on a mask plate for manufacturing the second OLED pixels are distributed regularly, which can reduce wrinkles of the mask plate.

Further, the first pixel unit 11 includes three first OLED pixels, and each first OLED pixel includes four first sub-pixels arranged at intervals in the first direction. Since the first pixel unit 11 includes three first OLED pixels of different colors, and the number of first OLED pixels in the first pixel unit 11 is three, the number of first OLED pixels of each color in the first pixel unit 11 is only one, that is, the first pixel unit 11 includes a first red OLED pixel 111, a first green OLED pixel 112, and a first blue OLED pixel 113. Wherein, the first red OLED pixel 111 includes four first red sub-pixels 101 arranged at intervals in the first direction, and the first green OLED pixel 112 includes four first green sub-pixels 103 arranged at intervals in the first direction. And the first blue OLED pixel 113 includes four first blue sub-pixels 105 arranged at intervals in the first direction.

With such an arrangement, an overall shape of the first pixel unit 11 is substantially rectangular, and the shape is relatively regular, images displayed in the first display region 10 is not prone to deform, and the quality of the image displayed in the first display region 10 may be improved. In addition, the shape of the first pixel unit 11 can be made similar to the shape of the second pixel unit 21, so that the display effects of the first display region 10 and the second display region 20 are more uniform. At the same time, the first pixel unit 11 is provided to include three first OLED pixels, and each first OLED pixel includes four first sub-pixels arranged at intervals in the first direction, which makes the density of the first pixel units 11 in the first display region 10 greater under a premise that the overall shape of the first pixel unit 11 is substantially rectangular, which helps to improve the display effect of the first display region 10.

In other embodiments of the present disclosure, the first pixel unit 11 may further include six first OLED pixels, and each first OLED pixel includes six first sub-pixels arranged at intervals in the first direction. That is, the first pixel unit 11 includes two first red OLED pixels 111, two first green OLED pixels 112, and two first blue OLED pixels 113. Wherein, each first red OLED pixel 111 includes six first red sub-pixels 101 arranged at intervals in the first direction, and each first green OLED pixel 112 includes six first green sub-pixels 103 arranged at intervals in the first direction, and each first blue OLED pixel 113 includes six first blue sub-pixels 105 arranged at intervals in the first direction. With such as arrangement, the overall shape of the first pixel unit 11 may also be substantially rectangular, which is relatively regular.

Figure 5:
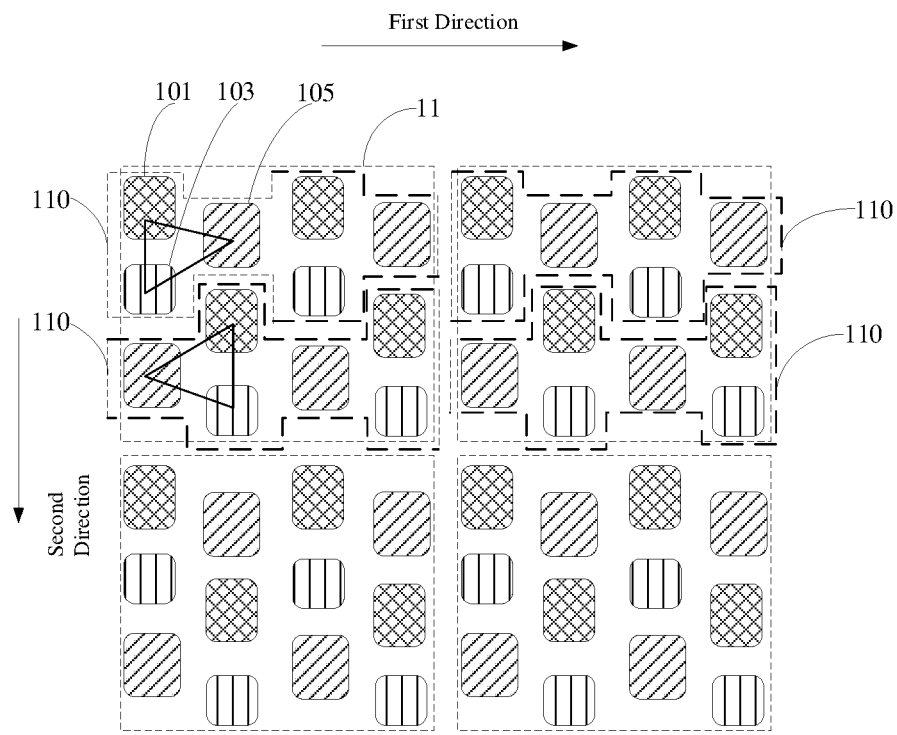
FIG. 5 illustrates a schematic view illustrating arrangement of first pixel groups in the first display region as illustrated in FIG. 4.

Further, referring to FIG. 5, the first sub-pixels of the first pixel unit 11 may comprise at least two first pixel groups 110 arranged in the second direction, and each of the first pixel groups 110 may be extended in the first direction. For two adjacent first pixel groups 110, first sub-pixels of one first pixel group 110 may be arranged in a first order, and first sub-pixels in the other first pixel group 110 may be arranged in a second order, wherein the first order may be a first red sub-pixel 101, a first green sub-pixel 103, and a first blue sub-pixel 105, and the second order may be a first blue sub-pixel 105, a first green sub-pixel 103 and a first red sub-pixel 101. The Y shape formed by the first sub-pixels which are arranged in the first order may be a shape formed by rotating the Y shape as illustrated in FIG. 5 by 90 degrees to the right, and the Y shape formed by the first sub-pixels which are arranged in the second order may be a shape formed by rotating the Y shape as illustrated in FIG. 5 by 90 degrees to the left. As illustrated in FIG. 5, the first sub-pixels of the first pixel unit 11 includes two first pixel groups 110. The first sub-pixels in one of the first pixel groups 110 are arranged in a first order, and the first sub-pixels of the other of the first pixel groups 110 are arranged in a second order. In other embodiments of the present disclosure, the first sub-pixels of the first pixel unit 11 may also include a first pixel group 110 having three or more first sub-pixels. With such an arrangement, colors of the adjacent first sub-pixels which are arranged in the first direction in the first display region 10 are all different, and the first sub-pixels of the same color are more uniformly distributed in the first display region 10, which facilitates to improve the display effect of the first display region 10.

Further, for first sub-pixels of two adjacent first pixel groups 110 of the first pixel unit 11, three first sub-pixels are arranged at intervals in the second direction, and colors of the three first sub-pixels arranged at intervals in the second direction are different. As illustrated in FIG. 5, in two adjacent first pixel groups 110, the three first sub-pixels arranged at intervals in the second direction are respectively a first red pixel 101 and a first green sub-pixel. The pixel 103 and the first blue sub-pixel 105. With such an arrangement, the colors of the first sub-pixels adjacently arranged in the second direction in the first display region 10 are all different, and the distribution of the first sub-pixels of the same color is more uniform, which can prevent uneven color distribution in some area in a case the first display region 10 displays due to an adjacent distribution of the first sub-pixels of same colors in the first display region 10, which in turn results in a bright bar of a single color in the region. Thus, the display effect of the first display region 10 may be improved.

In an embodiment of the present disclosure, as illustrated in FIG. 11, the second display region 20 may include a plurality of second pixel groups 210 arranged in the second direction, and each second pixel group 210 may be extended in the first direction. Each second pixel group 210 may include a second pixel unit 21. For two adjacent second pixel groups 210, the second OLED pixels of one second pixel group 210 are arranged in a third order, and the second OLED pixels of the other second pixel group 210 are arranged in a fourth order. The third order is a second red OLED pixel 211, a second green OLED pixel 212, a second blue OLED pixel 213 in sequence, and the fourth sequence is a second blue OLED pixel 213, a second green OLED pixel 212 and the second red OLED pixel 211 in sequence. Wherein, the Y shape formed by the second OLED pixels arranged in the third order may be a shape formed by rotating the Y shape as illustrated in FIG. 11 by 90 degrees to the right, and the Y shape formed by the second OLED pixels arranged in the fourth order may be a shape formed by rotating the Y shape as illustrated in FIG. 11 by 90 degrees to the left. With such an arrangement, the colors of the second OLED pixels arranged adjacently in the first direction in the second display region 20 are all different, and distribution of the second OLED pixels of the same color in the second display region 20 are more uniform, which facilitates to improve the display effect of the second display region 20.

Further, for two adjacent second pixel groups 210 of the second pixel unit 21, three second OLED pixels are arranged at intervals in the second direction, and as illustrated in FIG. 11, in the two second pixel groups 210, three second OLED pixels arranged at intervals in the second direction are a second red OLED pixel 211, a second green OLED pixel 212, and a second blue OLED pixel 213 in sequence. With such an arrangement, colors of the second OLED pixels arranged adjacently in the second direction in the second display region 20 are all different, so that distribution of the second OLED pixels of a same color are more uniform, which can prevent uneven color distribution in some area in a case the first display region 20 displays due to an adjacent distribution of the first sub-pixels of same colors in the first display region 20, which in turn results in a bright bar of a single color in the region. Thus, the display effect of the first display region 20 may be improved.

Figure 12:
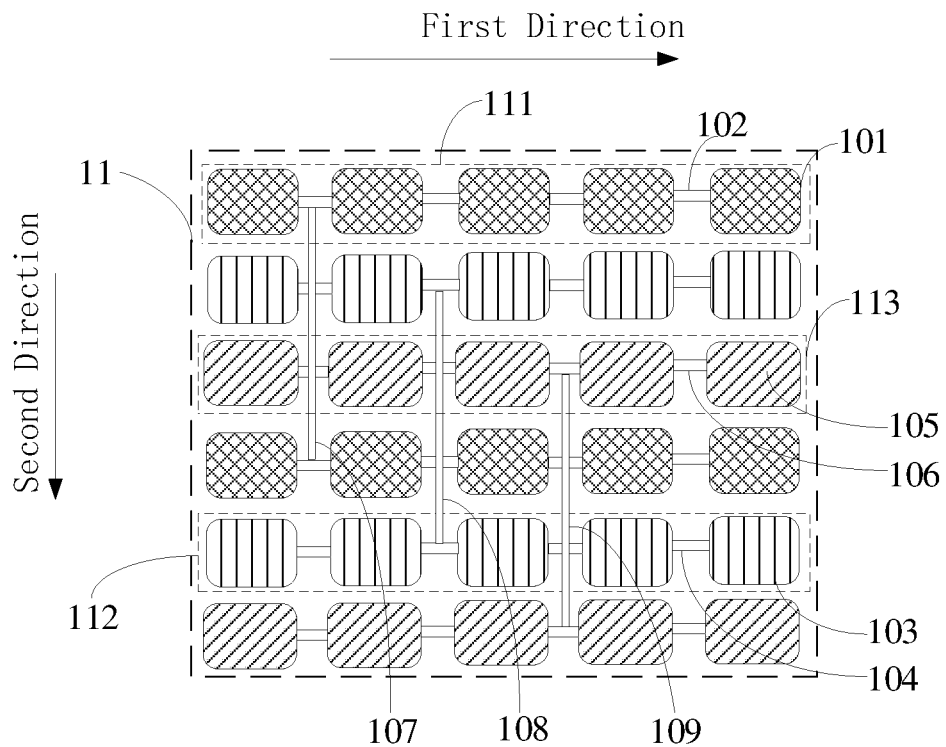
FIG. 12 illustrates a partial schematic diagram of another arrangement of first OLED pixels in the first display region of the display substrate according to an embodiment of the present disclosure.
Figure 13:
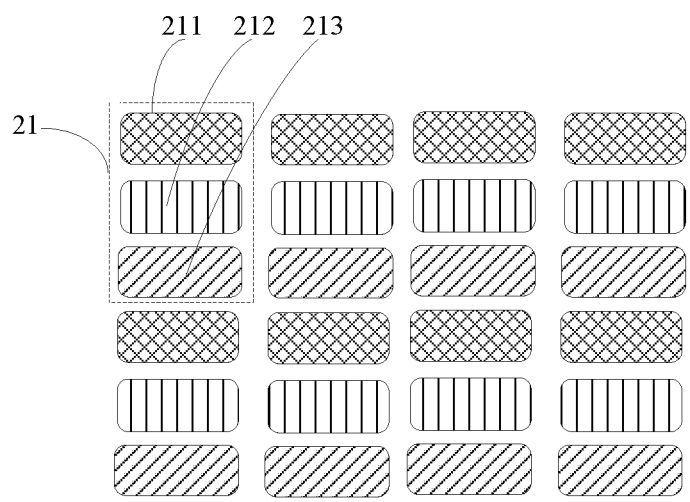
FIG. 13 illustrates a partial schematic diagram of another arrange of the second OLED pixels in the second display region of the display substrate according to an embodiment of the present disclosure.

In another embodiment of the present disclosure, a plurality of first OLED pixels of the same first pixel unit 11 may be arranged in parallel in the second direction, and a plurality of second OLED pixels of the second pixel unit 21 may be arranged in parallel in the second direction. Referring to FIG. 12, a first red OLED pixel 111, a first green OLED pixel 112, and a first blue OLED pixel 113 are arranged at intervals in the second direction in the first pixel unit 11 and side by side, thus, in the first pixel unit 11, the first red sub-pixel 101, the first green sub-pixel 103 and the first blue sub-pixel 105 are arranged at intervals in the second direction and side by side, for example, aligned in the second direction. Referring to FIG. 13, in the second pixel unit, the second red OLED pixel 211, the second green OLED pixel 212, and the second blue OLED pixel 213 are arranged at intervals and side by side in the second direction. With such an arrangement, the arrangement discipline of the first sub-pixels of the first pixel unit is consistent with the arrangement discipline of the second OLED pixels of the second pixel unit.

Further, for the plurality of first sub-pixels of the first pixel unit arranged in the second direction, colors of three adjacent first sub-pixels are different; and for the second OLED pixels of the second pixel unit arranged in the second direction, color of three adjacent second OLED pixels are different. Referring to FIG. 12, for the plurality of first sub-pixels of the first pixel unit arranged in the second direction, three adjacent first sub-pixels are respectively a first red sub-pixel 101, a second green sub-pixel 103, and a first blue sub-pixel 105. Referring to FIG. 13, for the second OLED pixels of the second pixel unit arranged in the second direction, three adjacent second OLED pixels are respectively a second red OLED pixel 211, a second green OLED pixel, and a second blue OLED pixel 213. This arrangement can make that the arrangement discipline of the first sub-pixels in the first pixel unit and the arrange discipline of the second OLED pixels in the second pixel unit more similar, which helps to improve consistency of the display effects of the first display region 10 and the second display region 20.

Further, as illustrated in FIG. 12, the first pixel unit 11 may further include a connecting bar, which connects the first electrode blocks of the first OLED pixels of the same color. Moreover, the same first OLED pixel includes a connecting portion connecting the first electrode blocks of two adjacent first sub-pixels. The connecting bar of the first OLED pixel may be disposed on the same layer as the first electrode block of the first OLED pixel, or may be arranged on a different layer from the first electrode block of the first OLED pixel. Regardless of the layer where the connecting bars are arranged, it is necessary to ensure that the connecting bars and the connection portions that are arranged on the same layer do not intersect with each other.

Of course, in other embodiments of the present disclosure, the first sub-pixels of the first OLED pixel of the first pixel unit may be arranged in a manner different from the manners as illustrated in FIG. 4, FIG. 7, or FIG. 12, and the second OLED pixels of the second pixel unit may be arranged in a manner different from the manners as illustrated in FIG. 11 and FIG. 13, as long as it is ensured that the arrangement manner of the first sub-pixels of the first pixel unit is in consistent with the arrangement manner of the second OLED pixel of the second pixel unit.

In one embodiment of the present disclosure, referring to FIG. 4 or FIG. 7, for at least two first sub-pixels of the same first OLED pixel, two adjacent first sub-pixels may be arranged in a staggered manner in the second direction. That is, for the first electrode blocks of the first OLED pixels, the two adjacent first electrode blocks are arranged in a staggered manner in the second direction. This arrangement can further reduce diffraction effect due to external light passing through the first display region 10f of the display substrate 100.

In an embodiment of the present disclosure, referring to FIG. 4 or FIG. 7, for the at least two first sub-pixels of the same first OLED pixel, axes of two first sub-pixels, which are separated by a first sub-pixel, in the first direction coincide with each other. In this way, arrangement of the first light-emitting structure blocks of the same first OLED pixel is more regular, and distribution of openings on a mask for manufacturing the light-emitting structure blocks is relatively regular. In addition, a single mask can be used to evaporate the light-emitting structure blocks of the first display region and the second display region on the display substrate in a single evaporation process, which further reduces wrinkles of screening as the patterns on the mask is relatively uniform.

In an embodiment of the present disclosure, referring to FIGS. 4 and 7, the same first pixel unit may further include a plurality of connecting portions. For example, the first OLED pixel 111 may include at least one connecting portion 102, and the first OLED pixel 112 may include at least one connecting portion 104, the first OLED pixel 113 may include at least one connection portion 106. In the same first OLED pixel, two adjacent first electrode blocks 1011 are electrically connected via a corresponding connecting portion. Wherein, adjacent first electrode blocks in the first red OLED pixel 111 are electrically connected via the connecting portion 102, the adjacent first electrode blocks in the first green OLED pixel 112 are electrically connected via the connecting portion 104, and the adjacent first electrode blocks in the blue OLED pixel 113 are electrically connected via the connecting portion 106.

Figure 6:
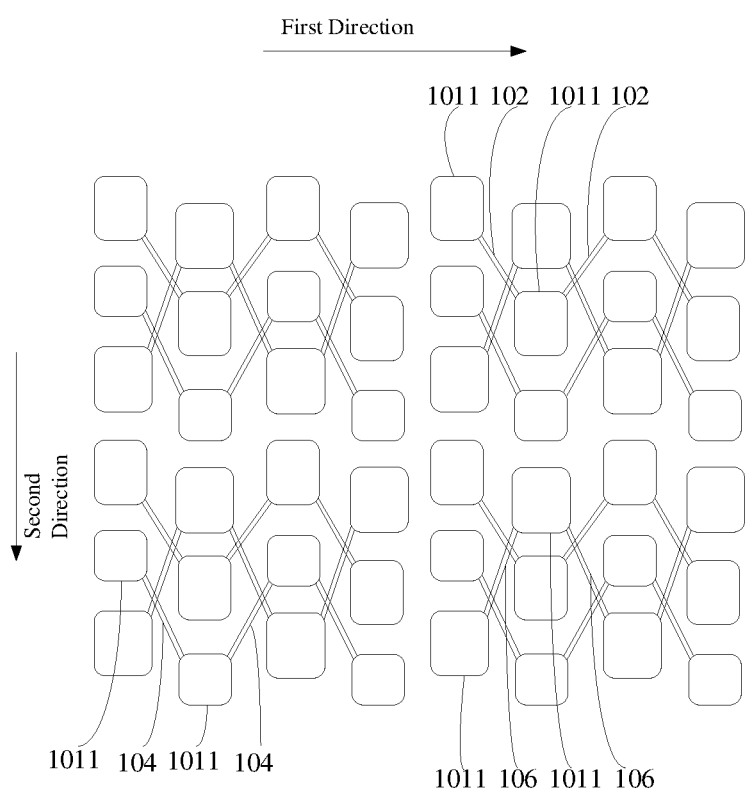
FIG. 6 illustrates a schematic view illustrating an orthographic projection of a first electrode block in the first display region as illustrated in FIG. 4 on the substrate.

In an embodiment of the present disclosure, the display substrate 100 further includes a substrate, and the first OLED pixel and the second OLED pixel are disposed on the substrate. In a case that the first sub-pixels of different colors in the first pixel unit 11 are arranged in a Y shape, projections of connecting portions of different first OLED pixels on the substrate may intersect. As illustrated in FIG. 6, projections of the connecting portion 102 and the connecting portion 104 on the substrate intersect a projection of the connecting portion 106 on the substrate, respectively. In a case that there are a plurality of connecting portions 102, 104, 106 in the same first pixel unit, at least some of the connecting portions and its corresponding first electrode block 1011 are disposed on different layers respectively. In this way, short circuit due to crossing of different connecting portions may be avoided, which ensures proper operations of the first OLED pixels, and wiring of the connecting portions are more flexible. In addition, a size of the first electrode block 1011 is not affected by the connection portion which is disposed on a different layer from the first electrode block 1011.

Figure 8:
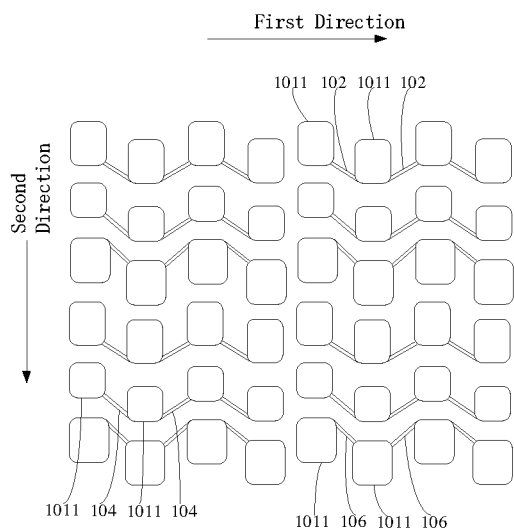
FIG. 8 illustrates a schematic diagram of an orthographic projection of the first electrode block in the first display region as illustrated in FIG. 7 on the substrate.

In another embodiment of the present disclosure, as illustrated in FIG. 8, in a case that the first OLED pixels of different colors in the first pixel unit 11 are arranged at intervals in the second direction, orthographic projections of connecting portions of different first OLED pixels on the substrate do no intersect with each other. As illustrated in FIG. 7, orthographic projections of connecting portion 102, connecting portion 104 and connecting portion 106 on the substrate do not intersect with each other. In this case, the connecting portions of each first OLED pixel may be disposed on the same layer or on different layers. The connecting portion and the corresponding first electrode block 1011 may be disposed on the same layer, or may be disposed on different layers. Preferably, the connecting portions of the first pixel unit 11 and the corresponding first electrode block 1011 may be disposed on the same layer respectively, and the first electrode block 1011 of the first pixel unit 11 and the connecting portions 102, 104, 106 may be formed in a single process, which may reduce the complexity of the preparation process to some extent.

In an embodiment of the present disclosure, in a case that the connecting portion and its corresponding first electrode block 1011 are arranged on different layers, the connecting portion may be disposed under the corresponding first electrode block 1011 respectively. With such an arrangement, the connecting portion does not affect display of the first OLED pixel.

Further, in a case that the first OLED pixel is driven in an active mode, the display substrate 100 further includes a pixel circuit for driving the first OLED pixel. The pixel circuit for the first OLED pixel may be a 1 transistor (1T) circuit, a 2 transistor and 1 capacitor (2T1C) circuit, a 3 transistor and 1 capacitor (3T1C) circuit, a 3 transistor and 2 capacitor (3T2C) circuit, a 7 transistor and 1 capacitor (7T1C) circuit, or a transistor and 2 capacitor (7T2C) circuit. Where T stands for transistors and C stands for capacitors. In a case that the connecting portion of the same first OLED pixel and the corresponding first electrode block 1011 are disposed on different layers, the connecting portion of the first OLED pixel may be disposed on the same layer as a gate electrode of the transistor, or disposed on the same layer as the upper plate of the capacitor, or disposed on the same layer as a source electrode of the transistor.

In an embodiment of the present disclosure, the display substrate 100 further includes a substrate, the first OLED pixel and the second OLED pixel are disposed on the substrate, and in a case that there are a plurality of connecting portions of the same first pixel unit 11, in a same first pixel unit, orthographic projections of the connecting portions on the substrate of which intersect with each other, may be disposed on different layers, and orthographic projections of connecting portions on the substrate of which do not intersect with each other, may be disposed on a same layer or on different layers. This arrangement can prevent proper operations of the first OLED pixel from being affected in a case the connecting portions whose orthographic projections on the substrate intersect with each other, are disposed on the same layer. Wherein, in a case that the connecting portions whose orthographic projections on the substrate intersect with each other are disposed on the same layer, these connecting portions may be formed in a single processing, thereby reducing the complexity of the manufacturing processing.

In an embodiment of the present disclosure, in a case that there are a plurality of connecting portions of one first OLED pixel, the connecting portions of the first OLED pixel may be disposed on the same layer. With this arrangement, a plurality of connecting portions of the same first OLED pixel may be formed in a single processing step, which simplifies the complexity of the manufacturing processing. For example, a plurality of connecting portions 102 of the first red OLED pixel 111 are disposed on the same layer, a plurality of connecting portions 104 of the first green OLED pixel 112 are disposed on the same layer, and a plurality of connecting portions 106 of the first blue OLED pixel 113 are disposed on the same layer.

In an embodiment of the present disclosure, in a case that the first sub-pixels of different colors of the first pixel unit 11 are arranged in a Y shape, referring to FIG. 4, orthographic projections of the connecting portions 102 of the first red OELD pixel 111 on the substrate and orthographic projections of the connecting portions 104 of the first green OLED pixel 112 on the substrate do not intersect with each other, and the connecting portions 102 and the connecting portions 104 may be disposed on the same layer. Orthographic projections of the connecting portions 106 of the first blue OLED pixel 113 on the substrate, orthographic projections of the connecting portions 102 of the first red OLED pixel 111 on the substrate, and orthographic projections of the connecting portions 104 of the first green OLED pixel 112 on the substrate intersect with each other, the connecting portions 106 of the first blue OLED pixel 113, the connecting portions 102 of the first red OLED pixel 111 and the connecting portions 104 of the first green OLED pixel 112 are disposed on different layers. Wherein, the connecting portions 102 of the first red OLED pixel 111 and the connecting portions 104 in the first green OLED pixel 112 may be respectively arranged on the same layer as the corresponding first electrode block 1011, and the connecting portions 106 of the first blue OLED pixel 113 and their corresponding first electrode blocks 1011 are disposed on different layers. Of course, in other embodiments of the present disclosure, it is further possible that the connecting portion 102 of the first red OLED pixel 111 and the connecting portion 104 of the greed first OLED pixel 112 are disposed and their respective first electrode block 1011 are disposed on different layers, while the connecting portion 106 of the first blue OLED pixel 113 and its corresponding first electrode block 1011 are disposed on the same layer; alternatively, the connecting portion 106 of the first blue OLED pixel 113, the connecting portion 102 of the first red OLED pixel 111, and the connecting portion 104 of the first green OLED pixel 112 are disposed on different layers, and the connecting portions of each of the first OLED pixels of the three colors and their corresponding first electrode block 1011 are disposed on different layers.

In an embodiment of the present disclosure, in a case that the connecting portion of the same first OLED pixel and its corresponding first electrode block 1011 are disposed on the same layer, a size of the connecting portion in a direction perpendicular to its extending direction is greater than 3 μm and is less than one half of the maximum size of the first electrode block 1011. For example, the size of the connecting portion in the direction perpendicular to its extending direction is a size in a plane extending in the first direction and the second direction. By setting the size of the connecting portion in the direction perpendicular to its extension direction to be greater than 3 μm, resistance of the connecting portion may be made relatively smaller; by setting the size of the connecting portion in the direction perpendicular to its extending direction to be smaller than one half of the maximum size of the first electrode block 1011, effect on the size of the first electrode block 1011 by providing the connecting portion is made less, and it is avoided that the size of the first electrode block 1011 is reduced due to a relative great size of the connecting portion, which in turn reduce effective light-emitting area of the first display region 10.

In an embodiment of the present disclosure, in a case that the first pixel unit 11 includes two or more first OLED pixels of same color, regarding the two or more first OLED pixels of the same color, first electrode blocks of different first OLED pixels are electrically connected, or the first electrode block of one first OLED pixel is electrically connected to the first electrode block of another first OLED pixel. Further, the first pixel unit may further be provided with a connecting bar. Regarding the first OLED pixels of a same color, the first electrode blocks of different first OLED pixels may be electrically connected via the connecting bar, or the first electrode block of one first OLED pixel is electrically connected to the first electrode block of the other first OLED pixel via the connecting bar.

Referring to FIG. 12, the first pixel unit 11 includes two first red OLED pixels 111, two first green OLED pixels 112 and two first blue OLED pixels 113. Wherein, the first electrode blocks of the two first red OLED pixels 111 are electrically connected via a connecting bar 107, the first electrode blocks of the two first green OLED pixels 112 are electrically connected via a connecting bar 108, and are electrically connected, and the first electrode block of the two first blue OLED pixels 113 are electrically connected via a connection part 109.

The connecting bar electrically connects the first electrode blocks of the two first OLED pixels of the same color, which can be achieved in the following two manners: a connecting portion of one first OLED pixel and a connecting portion of the other first OLED pixel are connected via the connecting bar; or, a first electrode block of one first OLED pixel is connected to a first electrode block of the other first OLED pixel via the connecting bar.

With such an arrangement, in a case the first OLED pixel is actively driven, two first OLED pixels of same color may be driven by a same pixel circuit, which can reduce the number of pixel circuits, thereby reducing complexity of a structure of the display substrate.

Figure 9:
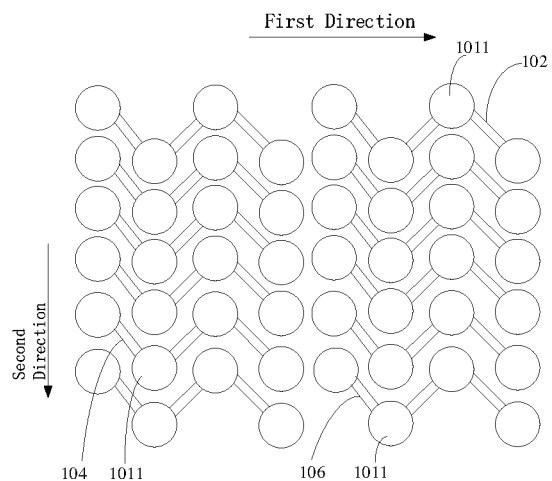
FIG. 9 illustrates a schematic diagram of an orthographic projection of the first electrode block in the first display region as illustrated in FIG. 7 on the substrate.
Figure 10:
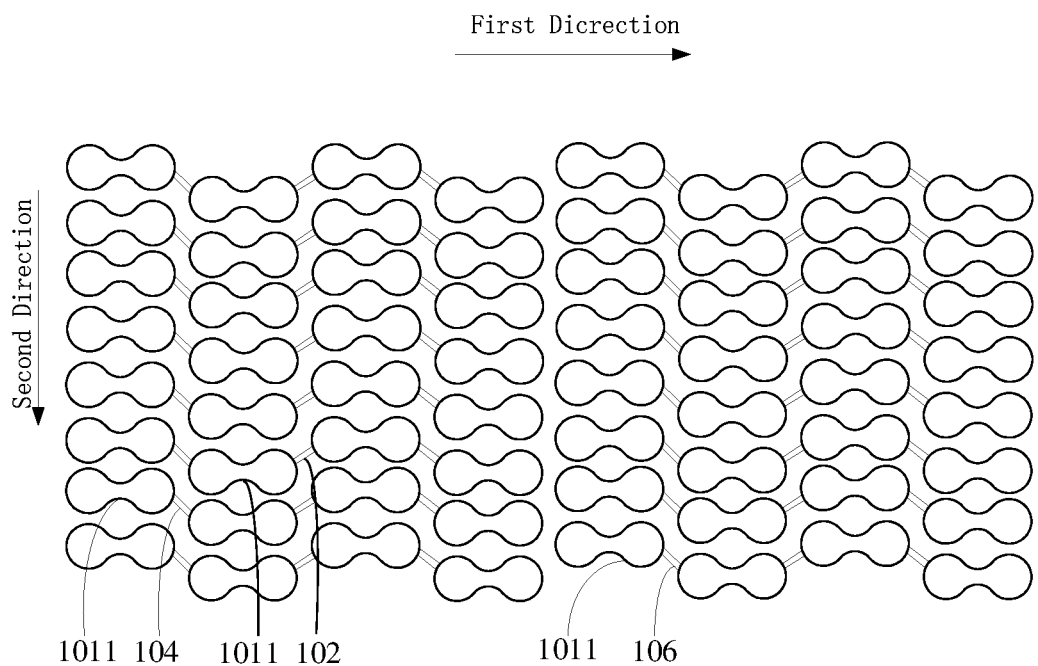
FIG. 10 illustrates a schematic diagram of still another orthographic projection of the first electrode block in the first display region as illustrated in FIG. 7 on the substrate.

In an embodiment of the present disclosure, orthographic projection of the first electrode block 1011 on the substrate may include a first graphic unit or a plurality of first graphic units that are connected. Wherein, the first graphic unit includes a circle, an oval, a shape of dumbbell, a shape of gourd, or a rectangle. The shape of dumbbell refers to a shape of pattern formed by connecting two circles with two parallel lines between the two circles, wherein a distance between the two lines is less than a diameter of the two circles, and the shape of the gourd refers to a shape of pattern that is formed by connecting two circles directly. The first graphic unit as illustrated in FIGS. 6 and 8 is rectangular, the first graphic unit as illustrated in FIG. 9 is circular, and the first graphic unit as illustrated in FIG. 10 is dumbbell-shaped. In a case that the first graphic unit is circular, elliptical, dumbbell-shaped or gourd-shaped, the first graphic unit may change the periodic structure generated by diffraction, that is, change distribution of diffraction field, thereby reducing diffraction effect generated in a case that the external incident light passes through the first display region 10, thereby ensuring that an image taken by the camera disposed under the first display region 10 has a higher definition.

In an embodiment of the present disclosure, a projection of the first light-emitting structure block in the first display region 10 on the substrate may include a second graphic unit or a plurality of second graphic units that are connected, and the second graphic unit may be same as the first graphic unit, or may be different from the first graphic unit. The projection of the first light-emitting structure block disposed on the first electrode block 1011 on the substrate is different from the projection of the first electrode block 1011 on the substrate, so as to further reduce the diffraction effect generated by the light passing through the first displaying region 10.

In an embodiment of the present disclosure, the second graphic unit may include a circle, an oval, a dumbbell, a gourd or a rectangle. In a case that the second graphic unit is circular, elliptical, dumbbell-shaped or gourd-shaped, the shape of the second graphic unit can change the periodic structure that produces diffraction, that is, change distribution of the diffraction field, thereby further reducing diffraction effect that is generated by external light passing through the first display region 10, and further ensuring that an image taken by the camera disposed below the first display region 10 has a higher definition.

In an embodiment of the present disclosure, the first electrode block 1011 may be an anode, the second electrode may be a cathode, and the second electrode may be a plane electrode.

In an embodiment of the present disclosure, a transmittance of the first electrode block 1011 and/or of the second electrode may be greater than or equal to 70%. Further, the transmittance of the first electrode block 1011 and/or of the second electrode may be greater than or equal to 90%, for example, the transmittance may be 90%, 95%, or the like. Such an arrangement can make the transmittance of the first display region 10 relatively great, so that the transmittance of the first display region 10 can meet requirements of the photosensitive device disposed below it on collecting light.

In an embodiment of the present disclosure, material for the first electrode block 1011 may include at least one of indium tin oxide, indium zinc oxide, indium tin zinc oxide, silver-doped indium tin oxide, silver-doped indium zinc oxide or graphene. Preferably, the material for the first electrode block 1011 is silver-doped indium tin oxide or silver-doped indium zinc oxide, so as to resistance of the first electrode block 1011 while guaranteeing the high transmittance of the first display region 10.

In an embodiment of the present disclosure, material for the second electrode may include at least one of indium tin oxide, indium zinc oxide, silver-doped indium tin oxide, silver-doped indium zinc oxide, graphene, magnesium, silver, or aluminum. In an embodiment of the present disclosure, the material for the second electrode is silver-doped indium tin oxide or silver-doped indium zinc oxide, so as to reduce the resistance of the second electrode while guaranteeing the high transmittance of the first display region 10.

In an embodiment of the present disclosure, the first OLED pixel may be driven in a passive driving mode or an active driving mode. In a case that the first OLED pixel is driven in an active driving mode, each of the first OLED pixels is driven by a pixel circuit.

In an embodiment of the present disclosure, referring to FIG. 1, the first display region 10 may be contiguous to the second display region 20, the first display region 10 may be at least partially surrounded by the second display region 20, and in a case that the first OLED pixel is driven in an active driving mode, a pixel circuit for the first OLED pixel may be disposed in the second display region 20. Such arrangement can reduce the complexity of the structure under the first OLED pixel in the first display region 10, and can reduce the complexity of the wiring under the first OLED pixel in the first display region 10, which helps to mitigate diffraction stacking generated by light passing through, thereby further improving quality of an image taken by the camera disposed under the first display region 10.

Further, the pixel circuit for the first OLED pixel may be disposed in an area of the second display region 20 adjacent to the first display region 10. With this arrangement, the length of the wiring between the first electrode block of the first OLED pixel and its corresponding pixel circuit can be reduced.

In another embodiment of the present disclosure, referring to FIG. 2, the display area of the display substrate 100 may further include a transition display region 30 disposed between the first display region 10 and the second display region 20. In the case that the OLED pixel is driven in an active driving mode, the pixel circuit for the first OLED pixel may be disposed in the transition display region 30. This arrangement can further reduce the complexity of the structure under the first OLED pixel in the first display region 10, reduce the complexity of the wiring under the first OLED pixel in the first display region 10, and help to mitigate diffraction stacking generated by the light passing through, thereby further improving quality of an image taken by the camera disposed under the first display region 10.

Further, the pixel circuit for the first OLED pixel may be arranged in an area of the transition display region 30 adjacent to the first display region 10. With this arrangement, a length of the wiring between the first electrode block of the first OLED pixel and its pixel circuit can be reduced.

In an embodiment of the present disclosure, a plurality of third pixel units are provided in the transition display region 30, and the density of the third pixel units may be equal to the density of the first pixel units in the first display region 10. With this arrangement, display effects of the first display region 10 and the transition display region 30 are similar, and the diversification of the pixel unit density in the display region of the display substrate 100 can be reduced to a certain extent, which lower inconsistence in display effects of various areas of the display region due to the diversification of the pixel unit density.

In another embodiment of the present disclosure, the density of the third pixel unit may be equal to the density of the second pixel unit. With this arrangement, display effects of the second display region 20 and the transition display region 30 are similar, and the diversification of the pixel unit density in the display region of the display substrate 100 can be reduced to a certain extent, which lower uniformity in display effects of various areas of the display region due to the diversification of the pixel unit density.

In other embodiments of the present disclosure, alternatively, the density of the third pixel unit may be different from the density of the first pixel unit and the density of the second pixel unit, for example, it may be greater than the density of the first pixel unit and less than the density of the first pixel unit.

In an embodiment of the present disclosure, the third pixel unit may include third OLED pixels of n colors, and n is a natural number not less than 3. Each of the third OLED pixels may include at least two third sub-pixels arranged at intervals in the first direction, and each of the at least two third sub-pixels may include a third electrode block, and a second light-emitting structure block disposed on the third electrode block, and a fourth electrode disposed on the second light-emitting structure block, wherein adjacent third electrode blocks of the same third OLED pixel are electrically connected.

Further, a first size of the third pixel unit may be greater than the first size of the second pixel unit and less than the first size of the first pixel unit. With this arrangement, the first sizes of the pixel units in the first direction gradually transits from the first display region to the second display region, which helps to improve the display effect.

In an embodiment of the present disclosure, the first electrode block of the first OLED pixel may be electrically connected to its pixel circuit via a transparent wiring. Since at least part of the transparent wiring is disposed in the first display region 10, this arrangement may further improve the transmittance of the first display region 10.

Further, transmittance of the transparent wiring is greater than or equal to 50%. In some embodiments of the present disclosure, the transmittance of the transparent wiring may be greater than 70%, for example, 80%, 90%, etc., to further increase the transmittance of the first display region 10.

Further, material for the transparent wiring may include at least one of indium tin oxide, indium zinc oxide, silver-doped indium tin oxide, silver-doped indium zinc oxide, or graphene. In some embodiments of the present disclosure, the material for the transparent wiring is silver-doped indium tin oxide or silver-doped indium zinc oxide, so as to reduce the resistance of the transparent wiring while guaranteeing high transmittance of the transparent wiring.

In an embodiment of the present disclosure, referring to FIG. 14, a first pixel definition layer 120 may be further provided in the first display region 10, and the first pixel definition layer 120 is disposed on the first electrode block 1011, a plurality of pixel openings are provided in the first pixel definition layer 120, and a plurality of first light-emitting structure 114 are disposed in the plurality of pixel openings in a one-to-one correspondence. The second OLED pixel includes a fifth electrode block 2011, a third light-emitting structure block 214 disposed on the fifth electrode block 2011, and a sixth electrode (not illustrated) disposed on the third light-emitting structure block 214, a second pixel definition layer 220 may be further provided in the second display region 20, the second pixel definition layer 220 is disposed on the fifth electrode block 2011, and a plurality of second pixel openings are provided in the second pixel definition layer 220, and a plurality of third light-emitting structure block 214 are disposed in the plurality of the second pixel openings in a one-to-one correspondence.

Further, transmittance of the first pixel definition layer 120 is greater than transmittance of the second pixel definition layer 220. With this arrangement, the transmittance of the first display region 10 may be increased, and the imaging effect of the camera disposed under the first display region 10 can be improved.

Further, transmittance of the first pixel definition layer 120 is greater than 70%. Furthermore, the transmittance of the first pixel definition layer 120 is greater than 90%, for example, it may be 90%, 92%, 95%, etc., so that the first display region 10 may have a better light transmission.

Further, material for the first pixel definition layer 120 may include polyorganosiloxane. This can ensure the high transmittance of the first pixel definition layer. Material for the second pixel definition layer 220 may include at least one of polyvinylpyridine or photosensitive polyimide. In this way, properties of the second pixel definition layer 220 are relatively stable and the service life of the second pixel definition layer 220 is relatively long.

Embodiments of the present disclosure further provide a display substrate. Referring to FIGS. 1 and 2, a display region of the display substrate 100 includes a first display region 10 and a second display region 20. Transmittance of the first display region 10 is greater than light transmittance of the second display region 20. Referring to FIGS. 15 and 16, a plurality of first pixel units 11 are provided in the first display region 10, and the first pixel units 11 include first OLED pixels 111, 112, 113 of n colors; a plurality of second pixel units 21 are provided in the second display region 20, and the second pixel units 21 include second OLED pixels 211, 212, and 213 of n colors, and n is a natural number not less than 3. A density of the first pixel unit 11 is less than a density of the second pixel unit 21.

A ratio of a first size of the first pixel unit 11 to a second size of the first pixel unit 11 and a ratio of a first size of the second pixel unit 21 to a second size of the second pixel unit 21 are substantially the same. The first size is a size of the pixel unit in the first direction, the second size is a size of the pixel unit in the second direction, and the first direction intersects the second direction. That is, the first size of the first pixel unit 11 is the size of the first pixel unit 11 in the first direction, and the second size of the first pixel unit 11 is the size of the first pixel unit 11 in the second direction; the first size of the second pixel unit 21 is the size of the second pixel unit 21 in the first direction, and the second size of the second pixel unit 21 is the size of the second pixel unit 21 in the second direction.

In the display substrate according to the embodiment of the present disclosure, light transmittance of the first display region 10 is greater than light transmittance of the second display region 20, thus a photosensitive device may be disposed under the first display region 10 to achieve full-screen display of the display substrate while guaranteeing proper operations of the photosensitive device. And meanwhile, the ratio of the first size to the second size of the first pixel unit 11 and the ratio of the first size to the second size of the second pixel unit 21 are substantially the same, then the shapes of the first pixel unit and the second pixel unit are similar, which can reduce probability of image deformation of the display substrate 100 during display due to a large difference in the shapes of the first pixel unit and the second pixel unit, thereby improving display effect of the display substrate 100, and enhancing the user experience.

In an embodiment of the present disclosure, n=3, that is, the first pixel unit 11 includes first OLED pixels of three different colors, and the second pixel unit 21 includes second OLED pixels of three different colors. The three colors may be red, green and blue, or other colors. In the following, description will be given by taking the three colors being red, green, and blue as examples, and any other combination of colors will not be elaborated herein. Of course, in other embodiments of the present disclosure, n may also be greater than 3.

In an embodiment of the present disclosure, an arrangement manner of the first OLED pixels in the first pixel unit 11 is consistent with an arrangement manner of the second OLED pixels in the second pixel unit 21. By setting the arrangement manner of the first OLED pixels in the first pixel unit to be the same as the arrangement discipline of the second OLED pixels in the second pixel unit, display effects of the first display region 10 and of the second display of the display substrate 100 may be made more uniform during display, which helps to enhance the user experience.

In an embodiment of the present disclosure, adjacent first OLED pixels of different colors in the first pixel unit 11 may be disposed in a Y shape, and adjacent second OLED pixels of different colors in the second pixel unit 21 may be disposed in a Y shape. Referring to FIG. 15, the first red OLED pixel 111, the first green OLED pixel 112, and the first blue OLED pixel 113 of the first pixel unit 11 are arranged in a Y shape; the second red OLED pixel 211, the second green OLED pixel 212, and the second blue OLED pixel 213 of the second pixel unit are arranged in a Y shape.

The arrangement order and positional relationship of the first OLED pixels in the first pixel unit 11 are similar to the arrangement order and positional relationship of the first sub-pixels as illustrated in FIG. 4, and the arrangement of the second OLED pixels in the second pixel unit 21 are similar to the arrangement order and positional relationship of the second OLED pixels as illustrated in FIG. 11. For more details, please refer to the above-mentioned related description, and will not be elaborated herein.

In another embodiment of the present disclosure, referring to FIG. 16, a plurality of first OLED pixels of one first pixel unit 11 are arranged side by side in the second direction; a plurality of second OLED pixels of one second pixel unit 21 are arranged side by side in the second direction.

The arrangement order and positional relationship of the first OLED pixels in the first pixel unit 11 are similar to the arrangement order and positional relationship of the first sub-pixels as illustrated in FIG. 12, and the arrangement order and position relationship of the second OLED pixels in the second pixel unit 12 are similar to the arrangement order and position relationship of the second OLED pixels as illustrated in FIG. 13. For specific details, please refer to the above-mentioned related description, and will not be elaborated herein.

In an embodiment of the present disclosure, the first OLED pixel may be driven in an active driving mode, a pixel circuit is provided in the first display region 10 for the first OLED pixel in a one-to-one correspondence. And for the pixel circuits for respective first OLED pixels in the first display region, pixel circuits of at least part of the first OELD pixels are provided in the first display region.

Further, the pixel circuit for the first OLED pixel is a 1T circuit, or a 2T1C circuit, or a 3T1C circuit, or a 3T2C circuit, or a 7T1C circuit, or a 7T2C circuit. Where T represents a transistor, and C represents a capacitor, that is, the pixel circuit for the first OLED pixel includes a transistor and/or a capacitor.

In an embodiment of the present disclosure, in the pixel circuit for the first OLED pixel, the transistors and/or the capacitors of the pixel circuit disposed in the first display region 10 may be made of a transparent conductive material. In this way, light transmittance of the first display region 10 may be improved.

Further, light transmittance of the transparent conductive material is greater than 70%. Furthermore, the light transmittance of the transparent conductive material may be greater than or equal to 90%, for example, the light transmittance may be 90%, 95%, etc. Such an arrangement can make the light transmittance of the first display region 10 relatively large, so that the light transmittance of the first display region 10 can meet requirements of the photosensitive device disposed below it on collecting light.

In an embodiment of the present disclosure, the transparent conductive material may include at least one of indium tin oxide, indium zinc oxide, silver-doped indium tin oxide, silver-doped indium zinc oxide, or graphene. In some embodiments of the present disclosure, the transparent conductive material may be silver-doped indium tin oxide or silver-doped indium zinc oxide to reduce the resistance of transistors and/or capacitors on the basis of ensuring high light transmittance of the first display region 10.

In another embodiment of the present disclosure, in the pixel circuit of the first OLED pixel, the transistors and/or capacitors of the pixel circuit disposed in the first display region 10 are made of opaque conductive materials. The opaque conductive material may be molybdenum, copper, aluminum, etc., which can make the resistance of transistors and capacitors relatively small.

Further, the opaque conductive material may be covered with a light-shielding material. The light-shielding material disposed on the transistor and the capacitor may block external light from being incident on the transistor and the capacitor, thereby prevent the properties of the transistor and the capacitor from being affected by external light.

The light-shielding material may include at least one of silver oxide or vinyl.

In an embodiment of the present disclosure, the first OLED pixel may include a first electrode block, a light-emitting structure block disposed on the first electrode block, and a second electrode disposed on the light-emitting structure block. The second OLED pixel may include a fifth electrode block, a third light-emitting structure block disposed on the fifth electrode block, and a sixth electrode disposed on the third light-emitting structure block.

The first display region 10 may further be provided with a first pixel definition layer, the first pixel definition layer is disposed on the first electrode block, and a plurality of first pixel openings are provided in the first pixel definition layer, and a plurality of first light-emitting structure blocks are disposed in the plurality of first pixel openings in a one-to-one correspondence. A second pixel definition layer may be further provided in the second display region 20, the second pixel definition layer is disposed on the fifth electrode block, and a plurality of second pixel openings are provided in the second pixel definition layer, and a plurality of the third light-emitting structure blocks are disposed in the plurality of second pixel openings in a one-to-one correspondence.

Further, light transmittance of the first pixel definition layer is greater than light transmittance of the second pixel definition layer. With such an arrangement, the light transmittance of the first display region can be increased, thereby improving imaging effect of the camera disposed below the first display region.

Further, light transmittance of the first pixel definition layer is greater than 70%. Furthermore, the light transmittance of the first pixel definition layer is greater than 90%, for example, it may be 90%, 92%, 95%, etc., so that the first display region 10 is made more transparent.

Further, material for the first pixel definition layer may include polyorganosiloxane. This can ensure that the light transmittance of the first pixel definition layer is high. Material for the second pixel definition layer may include at least one of polyvinylpyridine and photosensitive polyimide. In this way, the properties of the second pixel definition layer are relatively stable and the service life of the second pixel definition layer is relatively long.

In an embodiment of the present disclosure, the first direction and the second direction may be perpendicular to each other. The first direction may be a row direction and the second direction may be a column direction; or, the first direction may be a column direction, and the second direction may be a row direction. Wherein, the first direction as the row direction and the second direction as the column direction are just taken as examples for illustration in FIGS. 15 to 16 and other cases will not be illustrated.

Embodiments of the present disclosure further provide a display panel. The display panel includes any of the above-mentioned display substrate 100 and an encapsulation structure. The encapsulation structure is disposed on a side of the display substrate 100 away from the substrate.

In an embodiment of the present disclosure, the encapsulation structure may include a polarizer which covers at least the second display region 20. Further, the polarizer does not cover the first display region 10, and a photosensitive device that emits light or collects light passing through the first display region 10 may be disposed under the first display region 10. The polarizer may diffuse light reflected by a surface of the display panel to improve the user experience; the polarizer is not provided in the first display region 10 so as to improve the light transmittance of the first display region 10, thereby guaranteeing proper operations of the photosensitive device disposed under the first display region 10.

Embodiments of the present disclosure further provide a display device, which includes a device body and the display panel as described above. The device body has a device area, and the display panel covers the device body. Wherein, in a case that light transmittance of the first display region is greater than light transmittance of the second display region, the device area is located below the first display region, and the device area is provided with a photosensitive device that collects light passing through the first display region.

The photosensitive device may include a camera and/or a light sensor. Other devices other than the photosensitive devices, such as gyroscopes or earpieces, may further be disposed in the device area. The device area may be a grooved area, and the first display region of the display panel may be provided in close contact with the grooved area, so that the photosensitive device may emit light or collect light passing through the first display region.

The above-mentioned display device may be a digital device such as a mobile phone, a tablet, a palmtop computer, and an iPad.

In the figures, sizes of the layers and the regions may be exaggerated for clarity of illustration. It should be understood that in a case an element or layer is referred to as being "on" another element or layer, it can be directly on the other element or intervening layers therebetween may be present. In addition, it will be understood that in a case an element or layer is referred to as being "under" another element or layer, it can be directly under the other element, or there may be more than one intervening layer or element. In addition, it is also understood that in a case a layer or element is referred to as being "between" two layers or two elements, it can be the only layer between the two layers or two elements, or more than one intervening layer may further be present. Similar reference signs indicate similar elements throughout.

In this disclosure, the terms "first" and "second" are only used for descriptive purposes, and cannot be understood as indicating or implying relative importance. The term "plurality" refers to two or more, unless specifically defined otherwise.

After considering the specification and practicing the disclosure disclosed herein, those skilled in the art will easily think of other embodiments of the present disclosure. This disclosure is intended to cover any variations, applications, or adaptive changes of this disclosure. These variations, applications, or adaptive changes follow the general principles of this disclosure and include common knowledge or customary technical means in the technical field not disclosed in this disclosure. The description and embodiments are only regarded as exemplary, and the true scope and spirit of the disclosure are defined by the following claims.

It should be understood that the present disclosure is not limited to the exact structure that has been described above and illustrated in the drawings, and various modifications and changes can be made without departing from its scope. The scope of the disclosure is only limited by the appended claims.

The invention claimed is:

1. A display substrate, having a first display region and a second display region, a light transmittance of the first display region being greater than a light transmittance of the second display region, and comprising:
a substrate;
a plurality of first pixel units disposed in the first display region, each of the plurality of first pixel units comprising first OLED pixels of n colors, the first OLED pixels being disposed on the substrate, each of the first OLED pixels comprising at least two first sub-pixels arranged at intervals in a first direction,
wherein each of the first sub-pixels comprises:
a first electrode block;
a first light-emitting structure block, disposed on the first electrode block; and
a second electrode, disposed on the first light-emitting structure block; and
a plurality of second pixel units, disposed in the second display region, each of the second pixel units comprising second OLED pixels of n colors, and the second OLED pixels being disposed on the substrate;
wherein adjacent first sub-pixels of different first OLED pixels are arranged at intervals in a second direction, adjacent first electrode blocks of each of the plurality of first OLED pixels are electrically connected; and
a ratio of a first size of the first pixel unit in the first direction to a second size of the first pixel unit in the second direction is substantially same as a ratio of a first size of the second pixel unit in the first direction to a second size of the second pixel unit in the second direction, wherein the first direction intersects the second direction, and n is a natural number greater than or equal to 3.

2. The display substrate according to claim 1, wherein an arrangement manner of the first sub-pixels of the first pixel unit is same as an arrangement manner of the second OLED pixels of the second pixel unit.

3. The display panel according to claim 2, wherein the first pixel unit includes two or more first OLED pixels of a same color, and among the two or more first OLED pixels of the same color, one first OLED pixel is electrically connected to other first OLED pixel.

4. The display substrate according to claim 2, wherein a value of n is 3, and the first pixel unit comprises a first red OLED pixel, a first green OLED pixel, and a first blue OLED pixel, the first red OLED pixel comprises at least two first red sub-pixels, the first green OLED pixel comprises at least two first green sub-pixels, and the first blue OLED pixel comprises at least two first blue sub-pixel;
adjacent first sub-pixels corresponding to the three colors of the first pixel unit are arranged in a triangle, and adjacent second OLED pixels corresponding to the three colors in the second pixel unit are arranged in a triangle; and/or
a plurality of first OLED pixels of the first pixel unit are arranged in parallel in the second direction, and the plurality of second OLED pixels of the second pixel unit are arranged in parallel in the second direction.

5. The display substrate according to claim 4, wherein the first sub-pixels of the first pixel unit comprises at least two first pixel groups arranged in the second direction, each of the first pixel groups extends in the first direction, and in adjacent two first pixel groups, the first sub-pixels of one first pixel groups are arranged in a first order, and the first sub-pixels of the other first pixel group are arranged in a second order, and the first order is a red first sub-pixel, a green first sub-pixel, a blue first sub-pixel, the second order is a blue first sub-pixel, a green first sub-pixel, and a red first sub-pixel, in adjacent two first pixel groups of the first pixel unit, three first sub-pixels are arranged at intervals in the second direction, and the three first sub-pixels arranged at intervals in the second direction have different colors; and/or
the second display region comprises a plurality of second pixel groups arranged in the second direction, and each of the second pixel groups extends in the first direction; in adjacent two second pixel groups, the second OLED pixels of one second pixel group are arranged in a third order, and the second OLED pixels of the other second pixel group are arranged in a fourth order, the third order is the second red OLED pixel, the second green OLED pixel, and the second blue OLED pixel, and the fourth order is the second blue OLED pixel, the second green OLED pixel, and the second red OLED pixel, among adjacent two second pixel groups of the second pixel unit, three second OELD pixels are arranged at intervals in the second direction, and the three second OLED pixels arranged at intervals in the second direction have different colors.

6. The display substrate according to claim 2, wherein each of the first pixel units further comprises a plurality of connecting portions, and in one first OLED pixel, adjacent two first electrode blocks are electrically connected through a corresponding connecting portion;
among a plurality of connecting portions of a same first pixel unit, at least part of the plurality of connecting portions and a corresponding first electrode block are disposed on different layers; or
the connecting portions of the same first OLED pixel are disposed on a same layer.

7. The display substrate according to claim 6, wherein for the plurality of connecting portions, connecting portions whose orthographic projections on the substrate intersect with each other are disposed on different layers, and connecting portions whose orthographic projections on the substrate do not intersect with each other are disposed on a same layer or different layers.

8. The display substrate according to claim 6, wherein in a case that the connecting portions of the same first OLED pixel are disposed in a same layer with a corresponding first electrode block, a size of the connecting portion in a direction perpendicular to its extending direction is greater than 3 µm, and is less than one half of a maximum size of the corresponding first electrode block.

9. The display substrate according to claim 1, wherein for at least two first sub-pixels of a same first OLED pixel, two adjacent first sub-pixels are arranged in a staggered manner in the second direction; and/or
for at least two first sub-pixels of a same first OLED pixel, central axes of two first sub-pixels which are arranged at intervals of one first sub-pixel coincide in the first direction.

10. The display substrate according to claim 1, wherein an orthographic projection of the first electrode block on the substrate comprises a first graphic unit or a plurality of first graphic units which are connected; and/or
an orthographic projection of the first light-emitting structure block on the substrate comprises a second graphic unit or a plurality of second graphic units which are connected, and the second graphic unit is same as or different from the first graphic unit.

11. The display substrate according to claim 1, wherein a driving mode of the first OLED pixel is an active driving, and each of the plurality of first OLED pixels is driven by a pixel circuit; or
a driving mode of the first OLED pixel is a passive driving.

12. The display substrate according to claim 11, wherein the first display region is adjacent to the second display region, at least one portion of the first display region is surrounded by the second display region, and in a case that the driving mode of the first OLED pixel is the active driving, the pixel circuit corresponding to the first OLED pixel is disposed in the second display region; or the display substrate further comprises a transition display region disposed between the first display region and the second display region, and in a case that the driving mode of the first OLED pixel is the active driving, the pixel circuit corresponding to the first OLED pixel is arranged in the transition display region.

13. The display substrate according to claim 1, wherein the display substrate further comprises a transition display region disposed between the first display region and the second display region and a plurality of third pixel units are provided in the transition display region, a density of the plurality of third pixel units is equal to a density of the plurality of first pixel units; or, the density of the plurality of third pixel units is equal to the density of the plurality of second pixel units; or, the density of the plurality of third pixel units is greater than the density of the plurality of first pixel units, and less than the density of the plurality of second pixel units.

14. The display substrate according to claim 13, wherein each of the third pixel unit comprises third OLED pixels of n colors, wherein n is a natural number greater than or equal to 3; each of the third OLED pixels comprises at least two third sub-pixels arranged at intervals along the first direction, each of the at least two third sub-pixels comprises:
a third electrode block, electrically connected to an adjacent third electrode block of a same third OLED pixel;
a second light-emitting structure block, disposed on the third electrode block; and
a fourth electrode, disposed on the second light-emitting structure block.

15. The display substrate according to claim 14, wherein a first size of the third pixel unit is greater than the first size of the second pixel unit and less than the first size of the first pixel unit.

16. The display substrate according to claim 1, wherein a first pixel definition layer is further provided in the first display region, the first pixel definition layer is disposed on the first electrode block, and first pixel definition layer is provided with a plurality of first pixel openings, the first light-emitting structure blocks are disposed in the plurality of first pixel openings in a one-to-one correspondence;
each of the second OLED pixels comprises a fifth electrode block, a third light-emitting structure block disposed on the fifth electrode block, and a sixth electrode disposed on the third light-emitting structure block, and a second pixel definition layer is further provided in the second display region, the second pixel definition layer is disposed on the fifth electrode block, a plurality of second pixel openings are provided in the second pixel definition layer, and third light-emitting structure blocks are disposed in the second pixel openings in one-to-one correspondence.

17. A display panel, comprising:
the display substrate according to claim 1; and
an encapsulation structure disposed on the display substrate.

18. A display substrate, having a first display region and a second display region, a light transmittance of the first display region being greater than a light transmittance of the second display region, and comprising:
a plurality of first pixel units disposed in the first display region, each of the plurality of first pixel units comprises first OLED pixels of n colors; and
a plurality of second pixel units disposed in the second display region, each of the plurality of second pixel units comprising a plurality of second OLED pixels of n colors, where n is a natural number greater than or equal to 3; a light transmittance of the first display region is greater than a light transmittance of the second display region, and a density of the plurality of first pixel units is less than a density of the plurality of second pixel units;

wherein a ratio of a first size of the first pixel unit in a first direction to a second size of the first pixel unit in a second direction is substantially same as a ratio of a first size of the second pixel in a first direction to a second size of the second pixel in a second direction, wherein the first direction intersects the second direction.

19. The display substrate according to claim 18, wherein an arrangement manner of the first OLED pixels in the first pixel unit is same as an arrangement manner of the second OLED pixels in the second pixel unit.

* * * * *